Oct. 7, 1969 D. P. RYAN 3,471,717

BISTABLE DELAY-MULTIVIBRATOR

Filed Oct. 19, 1965

INVENTOR

DONALD P. RYAN

BY Browne, Schuyler & Beveridge

ATTORNEYS

United States Patent Office 3,471,717
Patented Oct. 7, 1969

3,471,717

BISTABLE DELAY-MULTIVIBRATOR

Donald P. Ryan, Cedar Grove, N.J., assignor to Aircraft Radio Corporation, Boonton, N.J., a corporation of New Jersey Filed Oct. 19, 1965, Ser. No. 497,922
Int. Cl. H03k 3/286
U.S. Cl. 307—290 8 Claims

ABSTRACT OF THE DISCLOSURE

A bistable delay-multivibrator circuit wherein the stages are direct current coupled through a current switch and delay is produced by an R-C network which is not a part of any feedback circuit. An input diode is used as a pulse operated switch for controlling the onset of the delay period. The delay can be interrupted at any time and restarted and the time delay can be varied by changing the breakdown value of the current switch. Further, the time delay can be varied by both R-C time constant changes and by selected breakdown level changes, either independently of one another or simultaneously, if desired.

The present invention relates in general to multivibrator circuits and, more particularly, to a bistable delay-multivibrator which has two stable states and one delay state.

The invention features a pair of amplifying elements (preferably transistors) or stages connected in a bistable multivibrator circuit configuration. A diode and resistance-capacitance network, at the input to the multivibrator circuit (outside the cross-connection and feedback circuitry of such multivibrator circuit) and a current switch in a coupling circuit between the stages, achieve the delay state in the multivibrator. In particular, a diode switch is rendered conductive on application of a trigger pulse thereto which initially triggers the multivibrator circuit and, at the same time, charges the capacitor which is in shunt with the input to the multivibrator circuit. Since the diode is conductive and has a low forward impedance, the capacitor charges at a rapid rate toward the amplitude of the input trigger pulse and will hold the multivibrator in its delay state for a period of time determined by the input impedance of the multivibrator and the resistance in shunt therewith and operation of the current switch in the coupling circuitry of the multivibrator.

The current switch in the coupling circuitry of the multivibrator may be a Zener diode so that the time delay then is a function of the value of the capacitance, the input impedance of the multivibrator, and resistance in shunt therewith, and the Zener breakdown voltage of the Zener diode. The current switch may also be a silicon controlled rectifier, or a transistor fed from a low impedance source and connected to a high resistance load. In any case, the delay time can be adjusted or varied by replacing the Zener diode with one having a different breakdown voltage, or by varying the control potential applied to the gate electrode of a silicon controlled rectifier or the base electrode of a common base transistor, or by varying the input impedance to the trigger circuit.

Variable delay multivibrators have many applications in electronics. One useful application for a variable delay multivibrator is in pulse width modulation. A further application is for variable delay in a voice operated switch wherein the overhang time of the switch can be made a function of the voice frequency or amplitude.

Where the delay is adjusted by adjusting the time constants or the input impedance of the multivibrator, the delay may take place both before and after switching. However, it should be appreciated that the delay depends upon the fact that both stages are only coupled when the current switch has been actuated. In addition, it should be noted that the delay is not independent of the input because, in the primary preferred configuration, the delay is initiated at the completion of the input pulse. The delay can be interrupted at any time and restarted.

The foregoing and other features and advantages of the invention will become apparent from the accompanying drawings, wherein.

Figure 3:
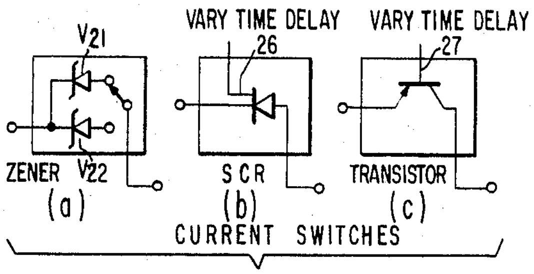
Figure 4:
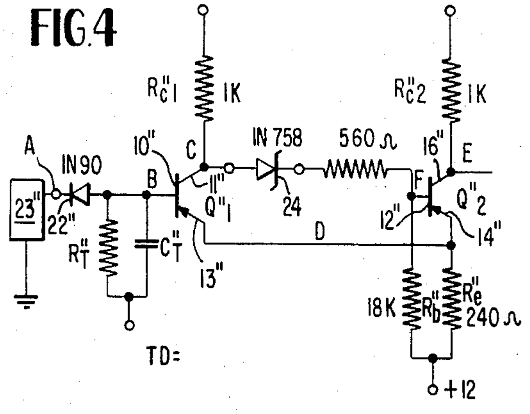
Figure 5:
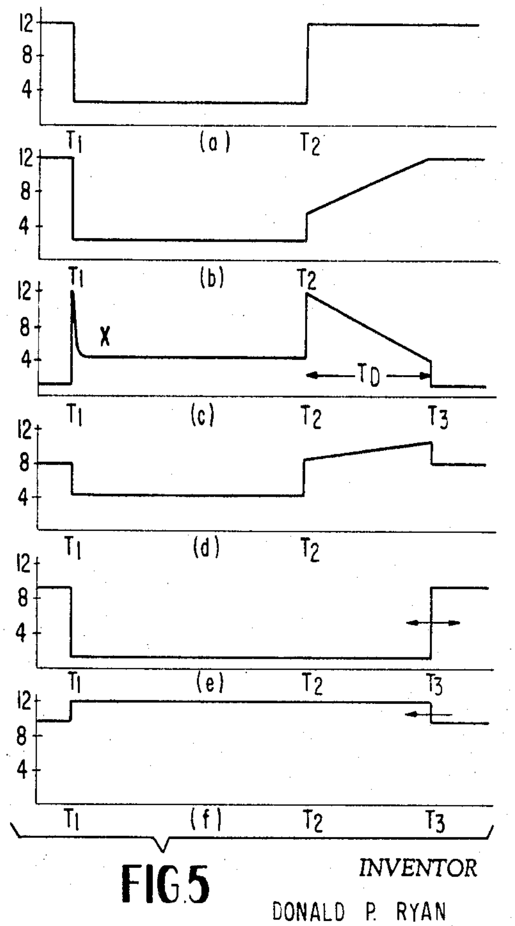

FIGS. 3(*a*), 3(*b*) and 3(*c*) are diagrammatic illustrations of three types of current switches which may be used in practicing the invention;

FIG. 4 is a detailed circuit diagram carrying component values of a particular bistable delay-multivibrator circuit embodying the invention; and FIGS. 5(*a*) through 5(*b*) are voltage waveforms at points A, B, C, D, E and F of FIG. 4.

While the invention will be described in connection with embodiments thereof in a Schmitt-type trigger circuit, it should be appreciated that it may be applied to other forms of multivibrator circuits.

Figure 1:
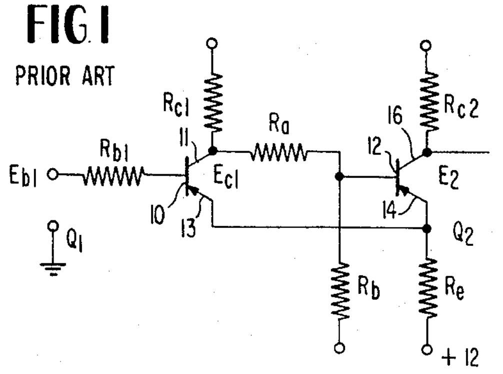
FIG. 1 is a circuit diagram illustrating a conventional Schmitt trigger circuit, and FIG. 1(*a*) and FIG. 1(*b*) are waveforms therefor.
Figure 1B:
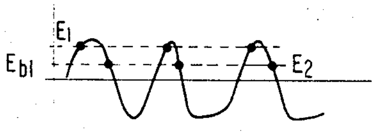
Figure 1A:
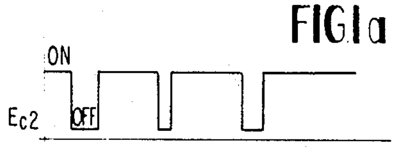

FIG. 1 discloses a conventional Schmitt trigger circuit wherein the switching time is speeded up by an additional regenerative feedback resistor R*e*. In the circuit of FIG. 1, base 10 of transistor Q1 is connected to a source of trigger pulses $Eb_1$. The collector resistance $Rc_1$ is connected to a source of negative potential or ground. The collector 11 is connected through stage coupling impedance or resistance R*a* to the base 12 of transistor Q2, while the emitter 13 of transistor Q1 is directly connected to the emitter 14 of transistor Q2 and such emitters have a common emitter resistance R*e*. A biasing potential is applied to the base 12 of transistor Q2 via base resistor R*b*. Resistor $Rc_2$ is the load impedance for transistor Q2 and the output of the Schmitt trigger may be taken from the collector 16 of transistor Q2.

The circuit of FIG. 1 operates in conventional fashion in that Q1 is cut off and Q2 is conducting in the quiescent state (or vice versa, if desired). The potential at the base 12 of transistor Q2 is a function of the potential $Ec_1$ at collector 11 of transistor Q1 and is determined by the ratio between resistors R*a* and R*b*. In addition, the potential at the emitters 13 and 14 is determined by the current flowing through the "on" transistor (Q2) and the value of emitter resistor R*e*. In this condition, transistor Q1 will remain cutoff until the potential at its base 10 is driven to a threshold level and the threshold level is established by the potential at emitter 13 thereof. Thus, as the input potential falls or is driven to the threshold level, transistor Q1 starts to conduct and in turn lowers the potential at collector 11 so as to decrease the potential on base 12 of transistor Q2. Thus, transistor Q2 conducts less so that the current in emitter 14 decreases lowering the potential across emitter resistor R*e*. This lowering of the potential at emitter 13 of transistor Q1 reduces the reverse bias thereof to where this transistor begins to conduct more. Regenerative action takes place and continues until the "off" transistor Q1 is fully conductive and the "on" transistor Q2 is cut off. The voltage E1 shown in the upper diagram of FIG. 1(*a*) is the "turn-on" threshold voltage, while the voltage E2 is the "turn-off" threshold voltage, it being apparent that it is not necessary that these potentials be the same. The output potential ($Ec_2$ at collector 16 of transistor Q2) switches from a high to low potential e.g., "on" to "off" and back as shown in the lower waveform of FIG. 1 (*a*).

THE PRESENT INVENTION

Figure 2:
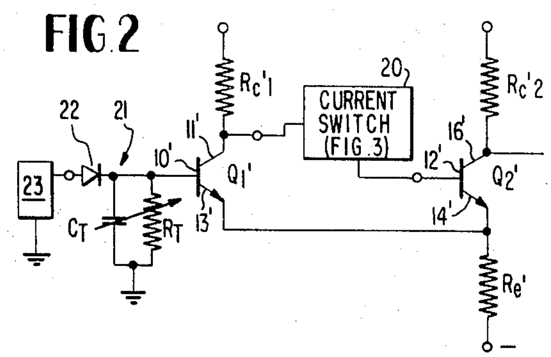
FIG. 2 is a schematic diagram showing the invention as applied to a multivibrator.

The circuits of the present invention differ in two related material respects. The first lies in the insertion of a current switch or voltage breakdown element between the stages and a diode and resistance-capacitance circuit at the input to the multivibrator circuit. Referring to FIG. 2, wherein component parts corresponding to parts in FIG. 1 are identified with corresponding prime numerals and/or letters, a current switch 20 is connected between collector 11′ of transistor Q1′ and base 12′ of transistor Q2′. Current switch 20 may be a Zener diode such as is shown in FIG. 3(*a*) connected in circuit as shown in FIG. 4, or a silicon controlled rectifier SCR (FIG. 3(*b*) ) or a transistor connected in a common base configuration (FIG. 3(*c*) ).

Secondly, a diode and resistance-capacitance circuit 21 is connected at the input side of the multivibrator circuit. Specifically, diode switch 22 is connected between trigger pulse source 23 and base 10′ of transistor Q1′ while timing capacitor C*t* and timing resistor R*t* are connected in parallel with each other and in shunt with the input to base 10′ of transistor Q1′. In the circuit of FIG. 2, transistors Q1 and Q2 are NPN type transistors and diode 22 is poled and connected accordingly to pass proper polarity triggering pulses to the base 10′ of transistor Q1′. Biasing potentials applied to transistors Q1′ and Q2′ are such that in a quiescent state (e.g., no trigger pulse applied) transistor Q1′ is "off" and transistor Q2′ is "on." As the potential at the anode of diode 22 approaches the threshold level, diode 22 conducts and turns transistor Q1′ on. The potential at base 10′ follows the trigger pulse in its initial application because the diode 22 is conducting and has a low forward impedance. Capacitor C*t*, therefore, charges toward the trigger potential and at a rather rapid rate.

In the quiescent state, current switch 20 is closed a.g., in a voltage breakdown state and is conducting rather heavily. This is due to the fact that transistor Q1′ is "off" or nonconductive in the quiescent state so that its collector potential is high. However, as soon as transistor Q1′ is rendered conductive by the application of a trigger pulse, the collector potential falls rapidly, due to the regenerative feedback, so that the current switch 20 opens. There is in effect an open circuit or very high resistance between transistors Q1′ and Q2′ in the switched or "on" condition of the multivibrator circuit. This condition will continue for as long as the trigger pulse is above the threshold level.

When the trigger pulse applied to diode 22 returns to a level below the threshold potential, diode 22 is back biased and capacitor C*t* begins to discharge through resistor R*t* and the input impedance of transistor Q1′ and thus this discharge current holds transistor Q1′ on or conductive. (While the waveforms of FIG. 5 are to be described in connection with the circuit of FIG. 4, it may be noted at this point that the discharge of capacitor C*t* begins at time T2.)

As long as current switch 20 remains open, the conductive state or condition of transistor Q2′ is controlled by the bias thereon and the regenerative current through the emitter circuit of transistor Q1′. As capacitor C*t* discharges, the potential at collector 11′ of transistor Q1′ follows at the same rate and the potential across the current switch 20 increases therewith. This is the delay period or state indicated by TD on the waveform diagrams. When the potential across current switch 20 reaches a conduction or ignition potential, it begins to conduct and with the help of the feedback potential developed across emitter resistor Re′, the multivibrator circuit returns to a quiescent state very rapidly. Thus, by varying the breakdown voltage of current switch 20, return to the quiescent state is corespondingly varied as indicated by the arrows in the waveform diagrams.

Thus, upon termination of the input trigger pulse, or the input trigger pulse falling below a level sufficient to maintain conduction of transistor Q1′, capacitor C*t* takes over control of transistor Q1′ and maintains conduction of that transistor for a time interval which is a function of the value of capacitor C*t*, the input impedance of transistor Q1′ (which includes resistance R*t* for these purposes) and the conduction potential of current switch 20. The delay therefore is initiated at the disappearance of the trigger pulse. However, as long as the input pulse is above a threshold value, the circuit remains switched. As soon as the input pulse is below the threshold value, the timing cycle starts. If the input pulse should rise again above the threshold value, the timing sequence will be interrupted and the circuit will remain switched. After the input pulse falls below the threshold value the timing cycle starts again and if the input pulse or the trigger pulse remains below the threshold level the timing will continue until the circuit switches back to the quiescent state.

The time delay may be varied by varying the input impedance of transistor Q1′. As shown, capacitor C*t* and resistor R*t* may be variable and diode 22 may be biased to adjust the threshold level. A preferred method however of varying the time delay is to vary the breakdown potential of current switch 20.

Current switch 20 may be a Zener diode (FIG. 3(*a*)) connected in the circuit as shown in FIG. 4. Note that the Zener diode 24 of FIG. 4 is poled in a reverse direction than the Zener diodes shown in FIG. 3(*a*) since the transistors Q1″ and Q2″ are PNP type transistors. Note also in this connection that diode 22″ is likewise poled in a reverse direction for the same reason. Zener diode 24 is selected to have a breakdown voltage which is a function of the desired time delay. As shown in FIG. 3(*a*) one of a plurality of Zener diodes having different breakdown on Zener voltages $Vz_1$, $Vz_2$ etc. may be selectively switched into the circuit. In the circuit shown in FIG. 4, the Zener diode can never have a forward bias on it so that conduction thereof will only take place at a time when the potential at collector 11″ is above the breakdown voltage of the Zener. Thus, by selecting a desired breakdown voltage, the time delay may be accordingly adjusted. In addition, the isolation introduced by Zener diode 24 allows transistor Q1″ to go through any phase of operation including a long charging up time or a long discharging time for capacitor C*t*″ and transistor Q2″ will not act until the Zener voltage is reached. These considerations are shown in the voltage waveform diagram shown in FIGS. 5(*a*) to 5(*f*) wherein the points A, B, C, D, E and F on FIG. 4 correspond to FIG. 5(*a*), FIG. 5(*b*), FIG. 5(*c*), FIG. 5(*d*), FIG. 5(*e*), and FIG. 5(*f*), respectively. At time T1, the trigger pulse applied at input terminals 23 falls below the threshold value and diode 22″ is forward biased so that this trigger pulse is applied directly to the base 10″ of transistor Q1″ to cause this transistor to begin to conduct. The potential at collector 11″ rises so that the potential across Zener diode 24 likewise decreases below until the breakdown or Zener voltage at which time the Zener diode is open to disconnect the base 12″ of transistor Q2″ from collector 11″ of transistor Q1″. This action, in conjunction with the regenerative action of resistor Re″, renders Q2″ nonconductive or "off." This condition will persist for as long as the time as the trigger pulse is above the threshold level of diode 22. When the trigger pulse falls below the threshold level, diode 22″ is nonconductive or reverse biased and capacitor C*t*″ begins to discharge to hold transistor Q1″ conductive. When capacitor C*t*″ has discharged to a point where the charge thereon is insufficient to maintain conduction of transistor Q1″ (time T3) the potential at collector 11″ of transistor Q1″ falls to a point (at time T3) which causes Zener diode 24 to go into Zener breakdown Vz at which time transistor Q2″ begins to conduct and, through the regenerative feedback potential developed at resistor Re″, the circuit returns to the quiescent state very rapidly.

Thus, in this embodiment, the time delay is a function of the value of capacitor Ct'', the input impedance of transistor Q1'' and the Zener breakdown voltage Vz.

Instead of a Zener diode being used as current switch 20, a silicon control rectifier (FIG. 3(*b*)) may be connected in the circuit between the collector of transistor Q1'' and base of transistor Q2''. In this case, a potential applied to gate electrode 26 can be used to adjust the firing time of the SCR and thus modulate the position of the trailing edge of the output pulse to effect pulse width modulation. Similarly, the common base transistor configuration can be utilized as the current switch 20. In such arrangement, it is of importance to note that the low impedance current source of the collector circuit of transistor Q1 when it is conducting and the high resistance input circuit of transistor Q2 facilitate this operation. A control current potential applied to base electrode 27 can be used to electrically control or modulate the position of the trailing edge of the output pulse in a fashion similar to that of a silicon controlled rectifier.

In summary, there has been disclosed and described a bistable delay multivibrator circuit wherein the stages are direct current coupled and delay is produced by an R-C network which is not a part of any feedback circuit. The delay provided by this invention can be interrupted at any time and restarted and the time delay can be varied by changing the breakdown value of the current switch as described above. Time delay can be varied by both R-C time constant changes and by selected breakdown level changes, either independently of one another or simultaneously, if desired.

While in FIG. 4, typical parameter values for an embodiment of the invention have been given, it is to be understood that these parameter values are merely exemplary and that the invention is not limited thereto.

While various embodiments of the invention have been shown and described, it is to be understood that further and obvious modifications will occur to those skilled in the art without departing from the scope of the invention.

What is claimed is:

1. A bistable delay-multivibrator circuit having in its unactivated state a normally conductive amplifying element and a normally nonconductive amplifying element, a coupling circuit coupling the output of one of said elements to the input of the other of said elements, means regeneratively coupling said amplifying elements and means for applying triggering pulse from a source to input terminals of said multivibrator circuit to activate same by rapidly reversing the conduction states of said amplifying elements, delay means for said multivibrator comprising a pulse storage capacitor means connected in shunt with said input terminals, a pulse controlled switch in series circuit between said pulse source and said input terminals closed on the application by said source of a trigger pulse thereto above a selected threshold level for charging said capacitor to the level of said trigger pulse and activating said trigger circuit to effect said rapid reversal of conduction states of said amplifying elements, said pulse controlled switch opening when said trigger pulse falls below said threshold level, and a voltage breakdown current switch in said coupling circuit, said voltage breakdown switch open circuiting said coupling circuit on application of said trigger pulse above the threshold of said pulse controlled switch, whereby application of a trigger pulse to said pulse controlled switch closes said pulse controlled switch to apply said trigger pulse to said input terminals and initiate switching of said multivibrator circuit from one stable conduction state to another stable conduction state, and charge said capacitor to the potential of said pulse and on opening of said pulse controlled switch said capacitor is discharged in such a way to maintain the said multivibrator circuit in its switched condition for a period of time determined by the value of said capacitance and the input impedance of said trigger circuit and the point of operation of said current switch.

2. The multivibrator circuit defined in claim 1 including means in said coupling circuit for varying the input impedance of said circuit.

3. The multivibrator circuit defined in claim 1 wherein said current switch is a Zener diode having a selected breakdown voltage.

4. The multivibrator circuit defined in claim 1 wherein said current switch is a silicon-controlled rectifier, and including means for applying a gate voltage to the gate electrode of said silicon-controlled rectifier.

5. The circuit defined in claim 1 wherein said current switch is a transistor having its emitter-collector circuit in series in said coupling circuit and including means for varying the voltage on the base electrode of said transistor to vary the time delay.

6. The multivibrator circuit defined in claim 1 wherein in the quiescent state of said multivibrator said current switch is conducting and operating in the breakdown voltage region thereof and in the switched conduction condition of said elements said current switch is nonconductive, and wherein said pulse controlled switch is a diode and further including a resistor connected in shunt with said pulse storage capacitor means, a variable voltage breakdown current switch connected in series in said coupling circuit, whereby the time interval during which the conduction states of said elements remain switched after the input pulse is below the said threshold level is a function of the capacitance of said pulse storage capacitance means, the resistance value of said resistor and the voltage breakdown point of said current switch.

7. The multivibrator circuit defined in claim 6 including means for varying the voltage breakdown of said current switch.

8. The multivibrator circuit defined in claim 6 wherein in the quiescent state of said multivibrator said current switch is conducting and operating in the breakdown voltage region thereof and in the switched conduction condition of said elements said current switch is nonconductive.

References Cited

UNITED STATES PATENTS

| | | | |
|---|---|---|---|
| 2,964,655 | 12/1960 | Mann | 307—290 |
| 3,109,944 | 11/1963 | Seestrom | 307—290 X |
| 3,287,608 | 11/1966 | Pokrant | 307—290 X |
| 3,381,141 | 4/1968 | Millon | 307—290 X |

JOHN S. HEYMAN, Primary Examiner

U.S. Cl. X.R.

307—284, 285